United States Patent
Liu et al.

(10) Patent No.: US 8,957,745 B2
(45) Date of Patent: Feb. 17, 2015

(54) SUPERLATTICE CRYSTAL RESONATOR AND ITS USAGE AS SUPERLATTICE CRYSTAL FILTER

(75) Inventors: Ping Liu, Jiangsu (CN); Yongyuan Zhu, Jiangsu (CN); Jingyu Wang, Jiangsu (CN)

(73) Assignee: Shoulder Electronics Co., Ltd., Jiangsu (CN)

(*) Notice: Subject to any disclaimer, the term of this patent is extended or adjusted under 35 U.S.C. 154(b) by 589 days.

(21) Appl. No.: 13/264,387

(22) PCT Filed: Jun. 13, 2010

(86) PCT No.: PCT/CN2010/073962
§ 371 (c)(1),
(2), (4) Date: Oct. 14, 2011

(87) PCT Pub. No.: WO2011/094986
PCT Pub. Date: Aug. 11, 2011

(65) Prior Publication Data
US 2012/0119848 A1   May 17, 2012

(30) Foreign Application Priority Data

Feb. 5, 2010  (CN) .......................... 2010 1 0120102

(51) Int. Cl.
```
H03H 9/00     (2006.01)
H03H 9/60     (2006.01)
H03H 9/02     (2006.01)
H03H 9/17     (2006.01)
H03H 9/54     (2006.01)
H03H 9/56     (2006.01)
H01L 41/083   (2006.01)
```

(52) U.S. Cl.
CPC ............. *H03H 9/605* (2013.01); *H03H 9/0095* (2013.01); *H03H 9/02015* (2013.01); *H03H 9/17* (2013.01); *H03H 9/542* (2013.01); *H03H 9/56* (2013.01)
USPC .......................................... 333/187; 310/321

(58) Field of Classification Search
CPC ............. H03H 9/00; H03H 9/02; H03H 9/15; H03H 9/54; H01L 41/00; H01L 41/083
USPC ........... 333/187, 188, 189, 190, 191; 310/321
See application file for complete search history.

(56) References Cited

U.S. PATENT DOCUMENTS

| | | | | |
|---|---|---|---|---|
| 4,349,796 A | * | 9/1982 | Chin et al. | 333/186 |
| 4,788,689 A | * | 11/1988 | Tokuda et al. | 372/45.012 |
| 6,720,844 B1 | * | 4/2004 | Lakin | 333/189 |

(Continued)

FOREIGN PATENT DOCUMENTS

| | | |
|---|---|---|
| CN | 1266553 A | 9/2000 |
| CN | 1383611 A | 12/2002 |

(Continued)

OTHER PUBLICATIONS

Min, Naiben, Dielectric Superlattice, Journal of Synthetic Crystals, Feb. 2006, vol. 30, No. 1, p. 10-27, ection 4, ub ection 4.1.

*Primary Examiner* — Dean Takaoka
(74) *Attorney, Agent, or Firm* — George G. Wang; Bei & Ocean

(57) ABSTRACT

A superlattice crystal resonator having a substrate of a dielectric acoustic superlattice material, both sides of which substrate are plated with electrodes. The resonator can be a one-port resonator if the electrode on both sides is a single electrode, or it can be a two-port resonator if the electrode on one side is a single electrode and the electrode on the other side is a bipolar electrode. The superlattice crystal resonator can be used as a superlattice crystal filter, either in the form of a monolithic superlattice crystal filter formed by a two-port superlattice crystal filter, or in the form of a combined superlattice crystal filter where a number of one-port superlattice crystal resonators are interconnected in various circuitry configurations with or without other electronic components, such as capacitors, inductors, and resisters.

11 Claims, 17 Drawing Sheets

(56) References Cited

U.S. PATENT DOCUMENTS 8,810,108 B2 * 8/2014 Wathen et al. .............. 310/321
2004/0041665 A1 3/2004 Hode et al.

FOREIGN PATENT DOCUMENTS

| CN | 1595799 A | 3/2005 |
| WO | WO-2009025056 A1 | 2/2009 |

* cited by examiner

SUPERLATTICE CRYSTAL RESONATOR AND ITS USAGE AS SUPERLATTICE CRYSTAL FILTER

FIELD OF THE INVENTION

The present invention relates to a resonator and a filter in a communication device, and more specifically, to a resonator of a dielectric, acoustic, superlattice crystal material and a filter of the same material.

BACKGROUND OF THE INVENTION

In recent years, the communication field has achieved notable technical progress in reducing the size and weight of a communication device such as a portable telephone. To achieve such technical progress, simplified and miniaturized components with various functions have been developed. At present, it is critical to improve the performance of the resonator and the filter used in communication devices.

The existing SAW (Surface Acoustic Wave) resonator has drawbacks because it has a low power handling capacity and is difficult to process when used for a high frequency situation.

The existing SAW resonator is characterized by good bandwidth selectivity (or "squareness index"), low insertion loss and small dimensions. However, as the existing SAW resonator has low power handling capacities, its application is limited when higher power handling capacities are necessary. The existing dielectric filter, on the other hand, has characteristics of low insertion loss and high power handling capacities, but has poor bandwidth selectivity (or "squareness index") and large dimensions so that the usefulness of the existing dielectric filter is rather limited when high selectivity is required. If its selectivity is to be increased, the insertion loss and dimension will be increased as well, which in turn increases the cost of the application.

Chinese Patent No. 97106837.2, entitled High-Frequency Device with Distributed Electric Domain Ferroelectric Crystal Acoustic Superlattice disclosed a ferroelectric multilayered-film acoustic superlattice crystal material, referred to as a dielectric acoustic superlattice crystal material, which is a microstructure dielectric whose piezoelectric coefficient is periodically modulated, with a modulation period similar to the wavelength of an ultrasonic wave (i.e., within micron or submicron ranges). The superlattices are formed along a certain direction with alternately arranged positive and negative ferroelectric domains, where the piezoelectric coefficient alternately changes signs "+" and "−" corresponding to positive domains and negative domains. As illustrated in FIGS. 1 and 2, when an external alternating electric field is applied, the domain interface vibrates and forms elastic waves that are propagated in the ferroelectric domains. In the figures, arrows represent propagation directions of the elastic waves, and the grids represent directions of the electric domains. Further, the modes of plating electrodes are different in FIGS. 1 and 2 (where the black side represents the side where an electrode is plated). Specifically, the side where an electrode is plated is perpendicular to the direction of the electric domain in FIG. 1 while it is parallel thereto in FIG. 2. According to different modes of plating electrodes, there are a total of two vibration modes. FIG. 1 illustrates a vibration mode that the sound propagation direction is perpendicular to the electric field direction, and FIG. 2 illustrates a vibration mode that the sound propagation direction is parallel to the electric field direction. When a wave vector of the elastic wave is equal to a superlattice modulated wave vector, a resonance enhancement effect is produced, showing characteristics of a resonator and the resonance frequency is determined only by the period of the superlattice.

SUMMARY OF THE INVENTION

In view of the drawbacks of the existing SAW resonator, SAW filter and dielectric filter, research has been conducted and an improvement has been made in the present invention to provide a superlattice crystal resonator with enhanced technical effects, and applications of such resonator as a superlattice crystal filter. The superlattice crystal resonator of the present invention is easy to process and has high power handling capacities, and the superlattice crystal filter has advantages of, such as, high power handling capacity, low insertion loss, small dimension, etc.

The technical scheme of the present invention is as follows:

A superlattice crystal resonator has a substrate of a dielectric acoustic superlattice material, both sides of which substrate are plated with electrodes. In one embodiment, both sides of said substrates each have one single electrode, being used as an electrical input and an electrical output, respectively. In another embodiment, the electrode on one side of said substrate is a bipolar electrode each pole of which is respectively used as an electrical input and an electrical output, and the electrode on the other side of said substrate is a single electrode connected with common ground.

The technical scheme of the present invention further relates to usage of the superlattice crystal resonator as a superlattice crystal filter. A first embodiment is to use the superlattice crystal resonator as a monolithic superlattice crystal filter. A second embodiment comprises a serial branch formed by superlattice crystal resonators, and parallel branches formed by parallel LC resonance circuits, wherein the first ends of the parallel branches are grounded and the seocnd ends thereof are respectively connected with the input and output of the serial branch and a serial connection node between the superlattice crystal resonators. The parallel LC resonance circuit is formed by connecting a capacitor branch in parallel with a serial branch formed by an inductor and a capacitor. A third embodiment comprises a serial branch formed by the superlattice crystal resonators and parallel branches also formed by the superlattice crystal resonators, wherein the first ends of said parallel branches are grounded and the second ends thereof are respectively connected with an input and output of the serial branch and serial connection node between the superlattice crystal resonators. A fourth embodiment comprises two serial branches formed by the superlattice crystal resonators and parallel branches also formed by the superlattice crystal resonators, where the first and second ends of said parallel branches are connected to the inputs, the outputs and the in-between serial connection node of the two serial branches, respectively.

The present invention achieves the following advantageous technical effects:

The superlattice crystal resonator of the present invention uses a dielectric acoustic superlattice crystal material as a substrate, and its resonance frequency is decided only by the vibration period of the superlattice itself and is independent of the thickness of the wafer. The thickness of the wafer may be selected according to actual processing capacity and skill. Therefore, it is possible to effectively solve problems in the prior art such as difficulty of processing a very thin wafer, insufficient power handling capacity, etc, which would occur when using an ordinary piezoelectric crystal to fabricate a high-frequency resonator.

The superlattice crystal filter of the present invention enjoys the combined advantages of an SAW filter and a dielectric filter. The filter fabricated by a substrate of a dielectric acoustic superlattice crystal material according to the present invention, in addition to the performance of an ordinary filter, has advantages of a high power handling capacity, high selectiveness ("squareness index"), low insertion loss, small dimension, low process cost, etc.

DETAILED DESCRIPTION OF PARTICULAR EMBODIMENTS OF THE INVENTION

Further description of specific embodiments of the present invention with reference to the drawings is provided in the following.

In all embodiments, the substrate material of the superlattice crystal resonator is a dielectric acoustic superlattice crystal material fabricated using a known process in the art disclosed in Chinese Patent Application No. 97106837.2. For all embodiments disclosed herewith, conventional testing methods were used to characterize the resonance properties or parameters of the superlattice crystal resonator and to characterize the filter properties or parameters of the superlattice crystal filter.

Embodiment 1

One-Port Superlattice Crystal Resonator

Figure 2:
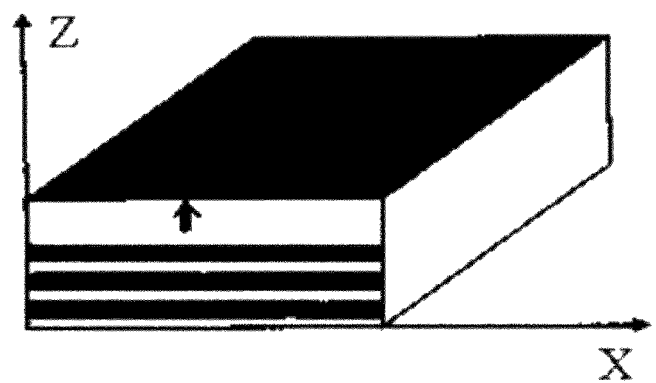
FIG. 2 depicts a vibration mode in which the sound propagation direction is parallel to the electric field direction.
Figure 3:
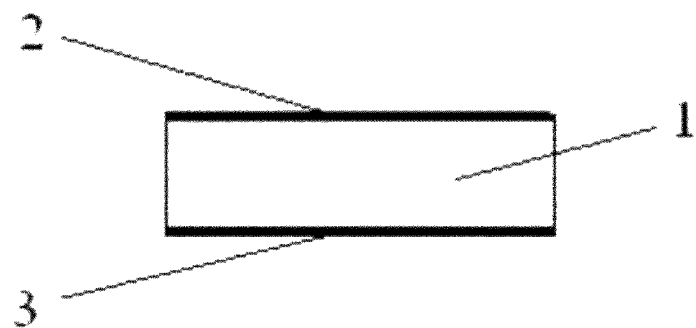
FIG. 3 depicts a sectional schematic layout view of a one-port superlattice crystal resonator.

As illustrated in FIG. 3, the superlattice crystal resonator of this embodiment comprises: a substrate 1 of a dielectric acoustic superlattice crystal material, wherein a metal electrode 2 and a metal electrode 3 are respectively plated on each side of the substrate 1, both the electrode 2 and the electrode 3 being continuous single electrode. The electrode 2 is used as an electrical input, and the electrode 3 is used as an electrical output. This structure is referred to as a one-port superlattice crystal resonator. Two vibration modes may be used: a vibration mode in which the sound propagation direction is perpendicular to the electric field direction as illustrated in FIG. 1 and a vibration mode in which the sound propagation direction is parallel to the electric field direction as illustrated in FIG. 2.

Figure 1:
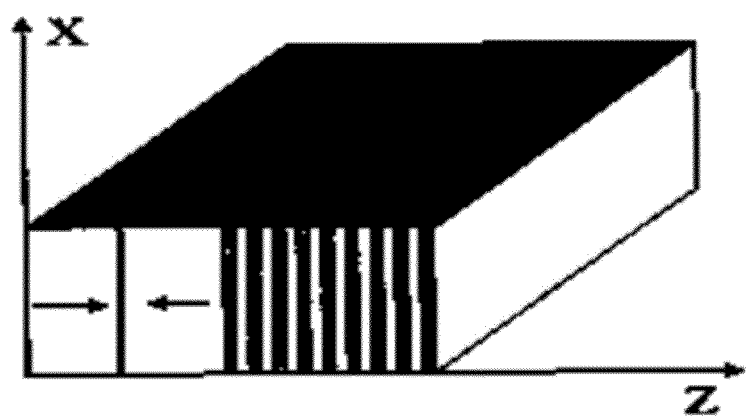
FIG. 1 depicts a vibration mode in which the sound propagation direction is perpendicular to the electric field direction.
Figure 4:
FIG. 4 depicts a characteristic output of a one-port superlattice crystal resonator using the vibration mode that the sound propagation direction is perpendicular to the electric field direction.

A superlattice crystal material with a vibration period of 7.8 μm was selected and cut into the substrate 1 with a size of 3.7 mm×1 mm×0.5 mm, and then the substrate 1 was plated with electrodes in the mode of FIG. 1, which resulted in a resonance frequency of 707.66 MHz with a loss of 1.9 dB, an anti-resonance frequency of 712.19 MHz with a loss of 23.0 dB. The resonance characteristics of a one-port resonator so obtained is shown in FIG. 4, where the vibration mode of FIG. 1 was used.

Figure 5:
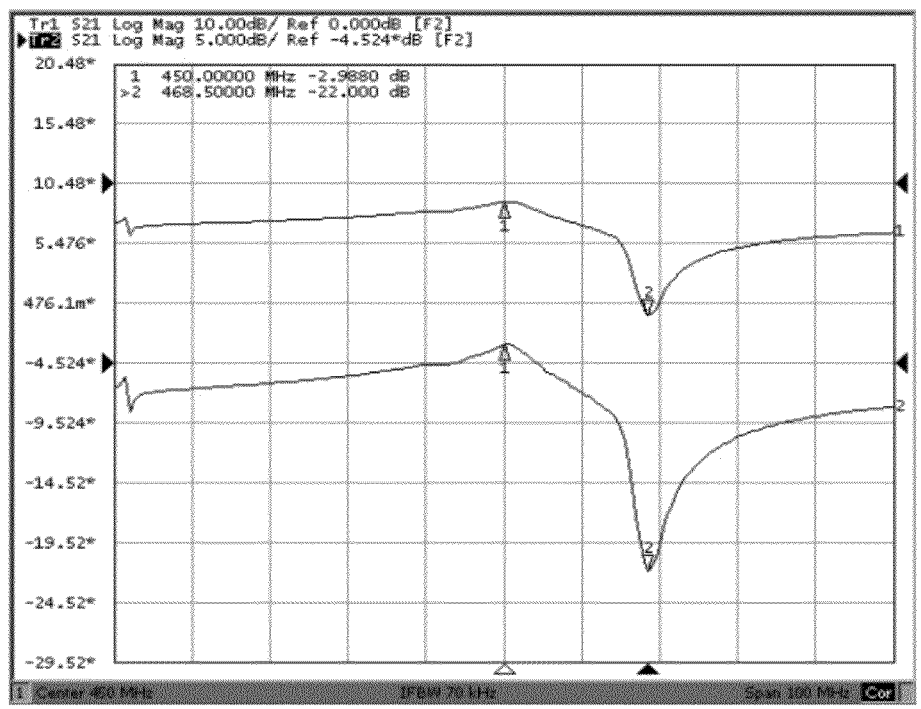
FIG. 5 depicts a characteristic output of a one-port superlattice crystal resonator using a vibration mode that the sound propagation direction is parallel to the electric field direction.

A superlattice crystal material with a vibration period of 7.8 μm was selected and cut into the substrate 1 with a size of 4 mm×0.8 mm×0.5 mm, and then the substrate 1 is plated with electrodes in the mode of FIG. 2, which resulted in a resonance frequency of 450 MHz with a loss of 3.0 dB, an anti-resonance frequency of 468.5 MHz with a loss of 22.0 dB. The resonance characteristics of a one-port resonator so obtained is shown in FIG. 5, where the vibration mode of FIG. 2 was used.

The above one-port resonators were then attached to a high-power radio frequency signal generator. When the power was adjusted to exceed 5 W and after operating for a while, the amplitude-frequency output of the resonator deteriorates. Therefore, it was determined that the maximum power capacity of the one-port resonators is 5 W.

Embodiment 2

Two-Port Superlattice Crystal Resonator

Figure 6:
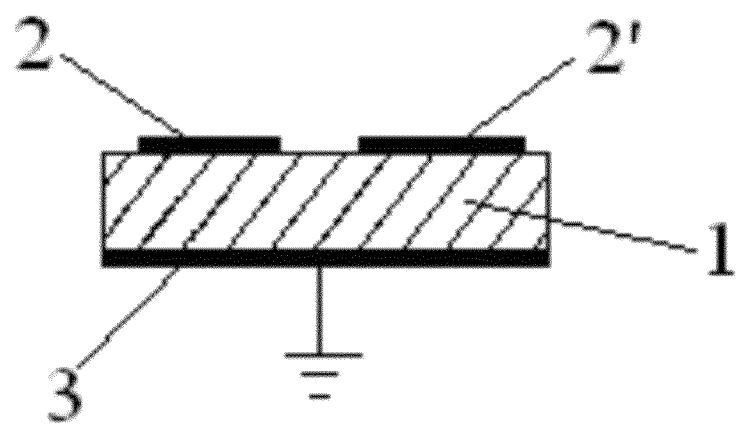
FIG. 6 depicts a sectional schematic layout view of a two-port superlattice crystal resonator.

As illustrated in FIG. 6, the superlattice crystal resonator of this embodiment comprises: a substrate 1 of a dielectric acoustic superlattice crystal material, wherein one side of the substrate 1 was plated with a metal electrode 2 and a metal electrode 2', of a divided rectangle shape, and the other side of the substrate 1 was plated with a undivided, continuous single electrode 3. The electrode 2 was used as an electrical input, the electrode 2' was used as an electrical output, and the electrode 3 is connected with common ground. This structure is referred to as two-port superlattice crystal resonator, which uses a vibration mode in which the sound propagation direction is perpendicular to the electrical field direction as illustrated in FIG. 1.

Figure 7:
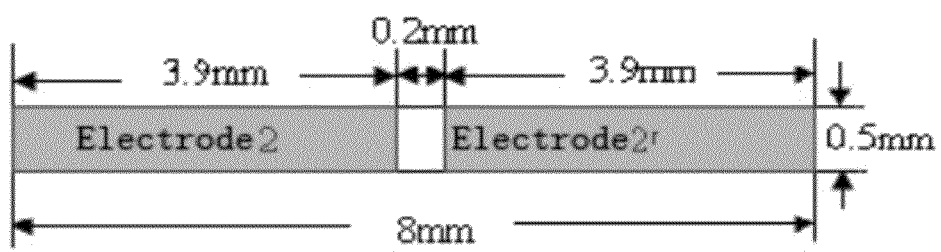
FIG. 7 is a top view of FIG. 6.
Figure 8:
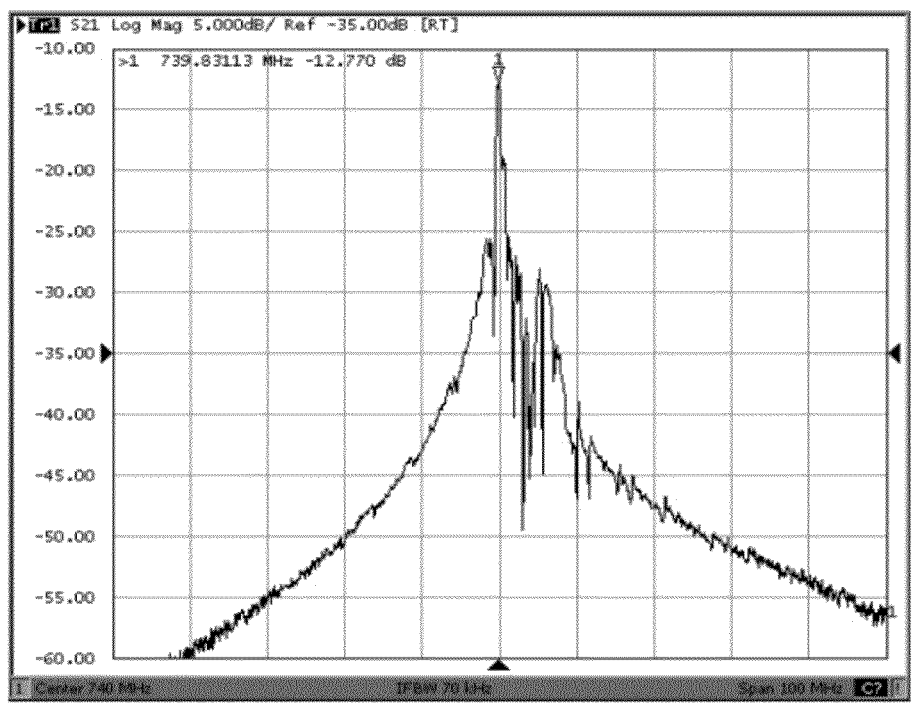
FIG. 8 depicts a characteristic output of the two-port superlattice crystal resonator illustrated in FIG. 6.

A superlattice crystal material with a vibration period of 7 μm was selected and cut into the substrate 1 with a size of 8 mm×1 mm×0.5 mm, and then the substrate 1 was plated with electrodes in the mode of FIG. 1. FIG. 7 is a top view of FIG. 6. As shown in FIGS. 6 and 7, the dimension of the electrode 3 is 8 mm×0.5 mm, and the electrode 2 and the electrode 2' each are a rectangle of 3.9 mm×0.5 mm and have a separation of 0.2 mm between them. A two-port resonator having a resonance frequency of 739.8 MHz with a loss of 12.8 dB was obtained, whose resonance performance is as illustrated in FIG. 8.

The above two-port resonator was then attached to a high-power radio frequency signal generator. When the power was adjusted to exceed 5 W and after operating for a while, the amplitude-frequency output property of the resonator deteriorated. Accordingly, it was determined that the maximum power capacity of the two-port resonator is 5 W.

Embodiment 3

Monolithic Superlattice Crystal Filter

Figure 9:
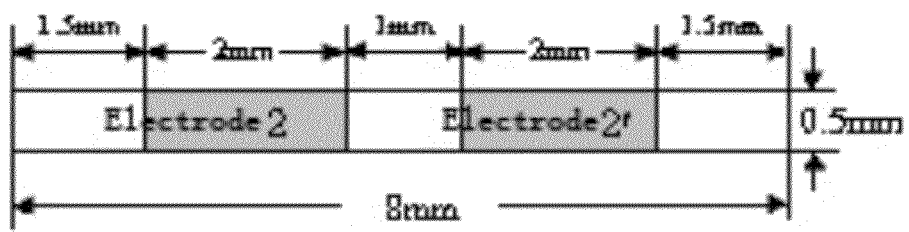
FIG. 9 depicts a schematic view of the shape and location of electrodes of a monolithic superlattice crystal filter.
Figure 10:
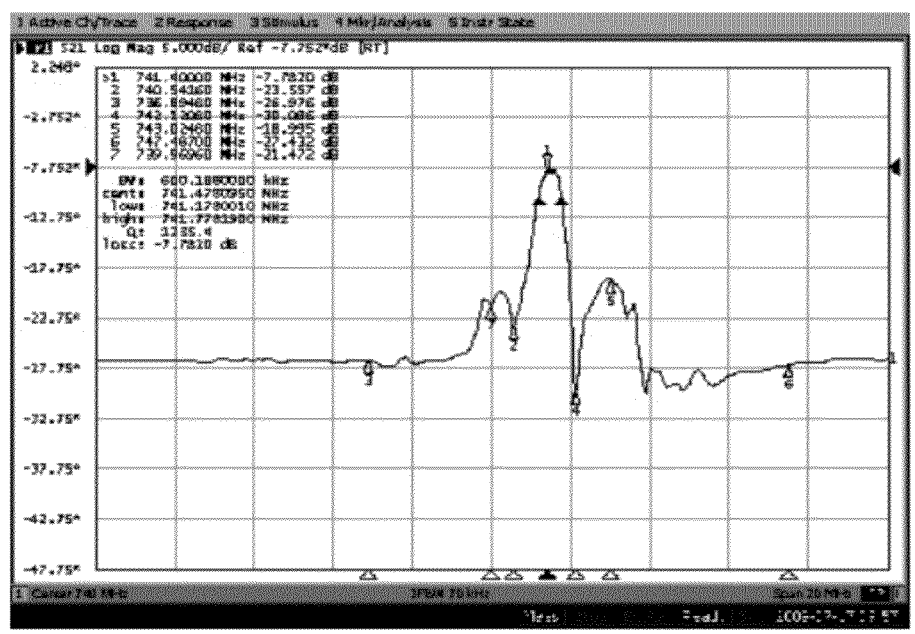
FIG. 10 depicts a filtering output characteristic of the superlattice crystal filter illustrated in FIG. 9.

The superlattice crystal filter of this embodiment was formed by a two-port superlattice crystal resonator as described in Embodiment 2 (see FIG. 6). In other words, a two-port superlattice crystal resonator as described in Embodiment 2 (see FIG. 6) can perform the function of a superlattice crystal filter. This structure is referred to as monolithic superlattice crystal filter A superlattice crystal material with a vibration period of 7 μm was selected and is cut into a substrate with a size of 8 mm×3 mm×0.5 mm, and then the substrate was plated with electrodes in the mode of FIG. 1. The dimension of electrode 3 was 8 mm×0.5 mm; electrode 2 and electrode 2' each were a rectangle of 2 mm×0.5 mm, having a separation of 1 mm between them and a distance of 1.5 mm from each end to the border of the substrate (see FIG. 9). A monolithic superlattice crystal filter having a center frequency of 741.4 MHz, bandwidth of 600 kHz, pass-band loss of 7.7 dB and stop-band loss of 19 dB was obtained. Its resonance performance is as illustrated in FIG. 10.

The above monolithic superlattice crystal filter was then attached to a high-power radio frequency signal generator. When the power was adjusted to exceed 5 W and after operating for a while, the amplitude-frequency output property of the filter deteriorated. Accordingly, it was determined that the maximum power capacity of the monolithic superlattice crystal filter is 5 W.

Embodiment 4

Combined Superlattice Crystal Filter A

Figure 11:
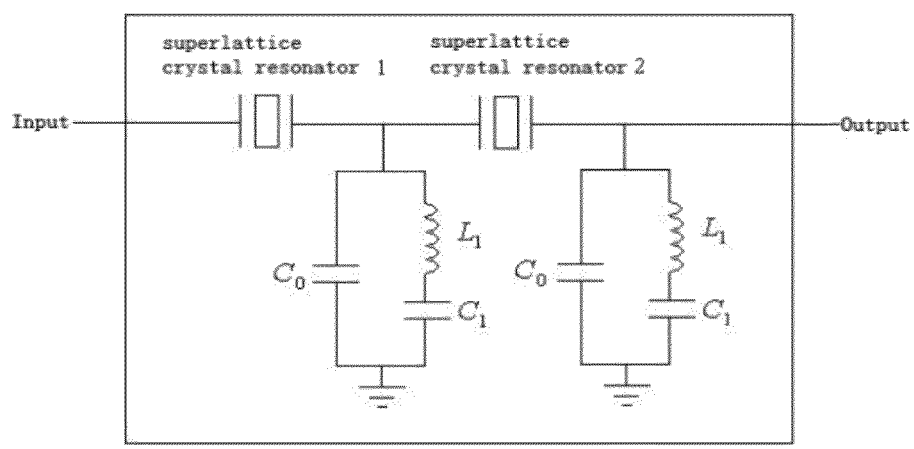
FIG. 11 depicts a schematic layout view of a combined superlattice crystal filter formed by connecting a serial branch formed by superlattice crystal resonators with parallel branches formed by LC resonance circuits.

As illustrated in FIG. 11, the superlattice crystal filter of this embodiment was formed by connecting a serial branch formed by two one-port superlattice crystal resonators as described in Embodiment 1 with parallel branches formed by two LC parallel resonance circuits, which is referred to as a combined superlattice crystal filter. Each LC parallel resonance circuit was formed by connecting a capacitor C0 branch in parallel with a serial branch of an inductor L1 and a capacitor C1. The specific structure of the combined superlattice crystal filter in this embodiment is as below: a one-port superlattice crystal resonator 1 and a one-port superlattice crystal resonator 2 are connected in series with each other, one end of the superlattice crystal resonator 1 being used as an input. The serial connection node between the superlattice crystal resonator 1 and the superlattice crystal resonator 2 and the other end of the superlattice crystal resonator 2 are respectively connected to the first ends of the two LC resonance circuits, and the second ends of the two LC resonance circuits are connected to common ground.

In this embodiment, the center frequency was 457 MHz, and the bandwidth was 12 MHz. Two superlattice crystal material substrates with a vibration period of 7.8 μm were selected and plated with electrodes in the mode of FIG. 2. Two superlattice crystal resonators with a resonance frequency of 460 MHz and an anti-resonance frequency 467 MHz were obtained and used as resonators of the serial branch. In the LC resonance circuit of each of the two parallel branches, the serial capacitor C1 was 2.7 pF, the serial inductor L1 was 53.5 nH, and the parallel capacitor C0 is 8 pF. Each of the two LC resonance circuits had a resonance frequency of 433 MHz and an anti-resonance frequency of 484 MHz.

Figure 12:
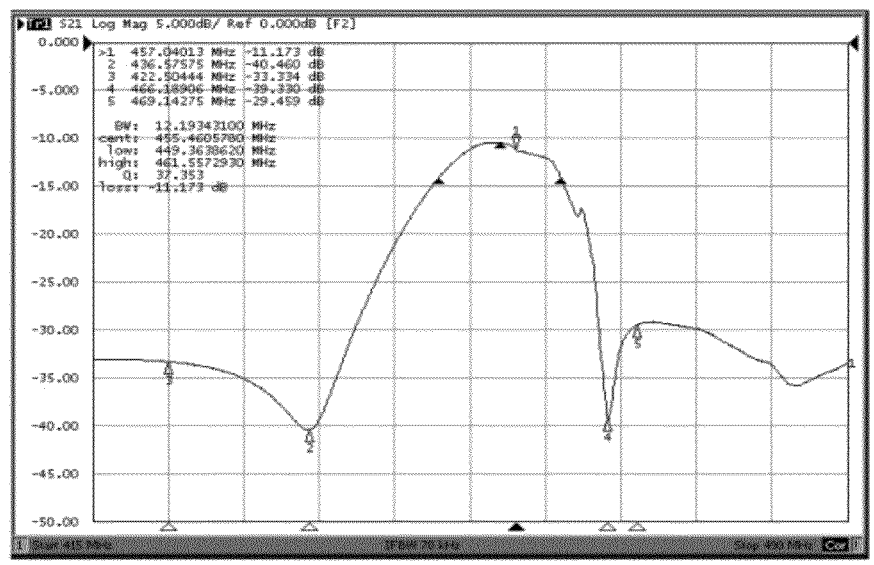
FIG. 12 depicts a filtering output characteristic of the superlattice crystal filter illustrated in FIG. 11.

Around 460 MHz, the superlattice crystal resonators of the serial branch operate around the resonance point and the LC resonance circuits of the parallel branches operate around the anti-resonance point, so that at this moment the impedance is the smallest, thereby forming the pass band of the filter. Around 466 MHz and 436 MHz, the superlattice crystal resonators of the serial branch operate around the anti-resonance point and the LC resonance circuits of the parallel branches operate around the resonance point, so that at this moment the impedance is the largest, thereby forming the stop band of the filter. The following filtering performance of the combined superlattice crystal filter was obtained by measurement: pass-band loss of 11 dB, and stop-band loss of 29 dB (see FIG. 12). The dimension of the entire superlattice crystal filter was 21 mm×12 mm×6 mm.

The above combined superlattice crystal filter was then attached to a high-power radio frequency signal generator. When the power was adjusted to exceed 5 W and after operating for a while, the amplitude-frequency output property of the filter deteriorated. Accordingly, it was determined that the maximum power capacity of the combined superlattice crystal filter is 5 W.

Embodiment 5

Combined Superlattice Crystal Filter B

Figure 13:
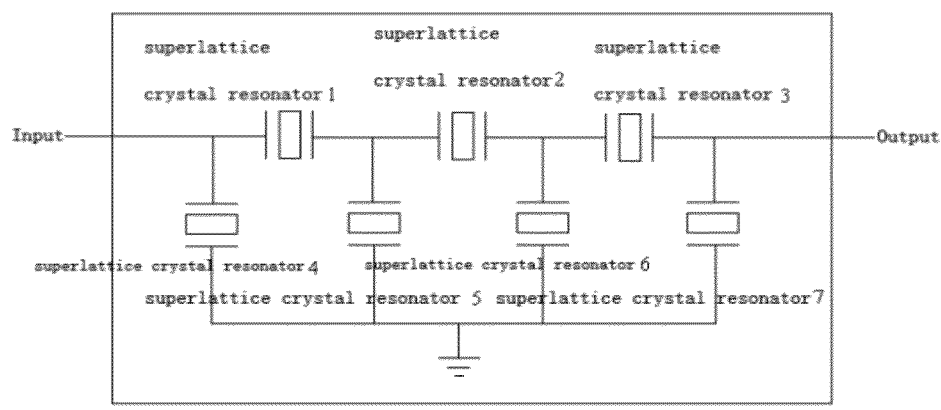
FIG. 13 depicts a schematic layout view of a combined superlattice crystal filter formed by connecting a serial branch formed by superlattice crystal resonators with parallel branches also formed by superlattice crystal resonators.

As illustrated in FIG. 13, the superlattice crystal filter according to this embodiment was entirely formed by superlattice crystal resonators, which is also referred to as a combined superlattice crystal filter. The combined superlattice crystal filter comprised: three superlattice crystal resonators 1, 2, 3 forming a serial branch and four superlattice crystal resonators 4, 5, 6, 7 forming parallel branches. Each of the seven superlattice crystal resonators was a one-port superlattice crystal resonator as described in Embodiment 1. The specific structure of the combined superlattice crystal filter in this embodiment is as below: the superlattice crystal resonators 1, 2, 3 were connected in series with one another; one end of the superlattice crystal resonator 1 was used as an input, and one end of the superlattice crystal resonator 3 was used as an output, two ends and two in-between nodes of the serial branch were connected to the first ends of the superlattice crystal resonators 4-7, respectively, and the second ends of each of the superlattice crystal resonators 4-7 was connected to common ground.

In this embodiment, the center frequency is 277.8 MHz, and the bandwidth is 22 MHz. Superlattice crystal material substrates with a vibration period of 13.7 μm were selected and were plated with electrodes in the mode of FIG. 2. Three superlattice crystal resonators forming the serial branch had a resonance frequency of 276.2 MHz and respective anti-resonance frequencies of 301.6 MHz, 302.5 MHz, and 300.1 MHz. Superlattice crystal material substrates with a vibration period of 15.1 μm were selected and plated with electrodes in the mode of FIG. 2. Four superlattice crystal resonators of the parallel branches had a resonance frequency of 235.5 MHz and respective anti-resonance frequencies of 276.1 MHz, 277.7 MHz, 276.1 MHz, and 277.7 MHz.

Figure 14:
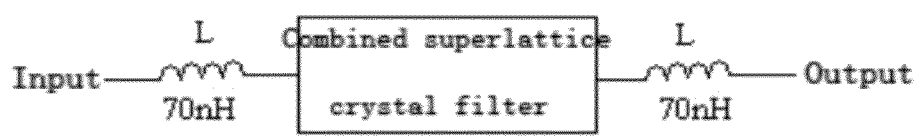
FIG. 14 depicts a peripheral matching circuit for the superlattice crystal filter illustrated in FIG. 13.
Figure 15:
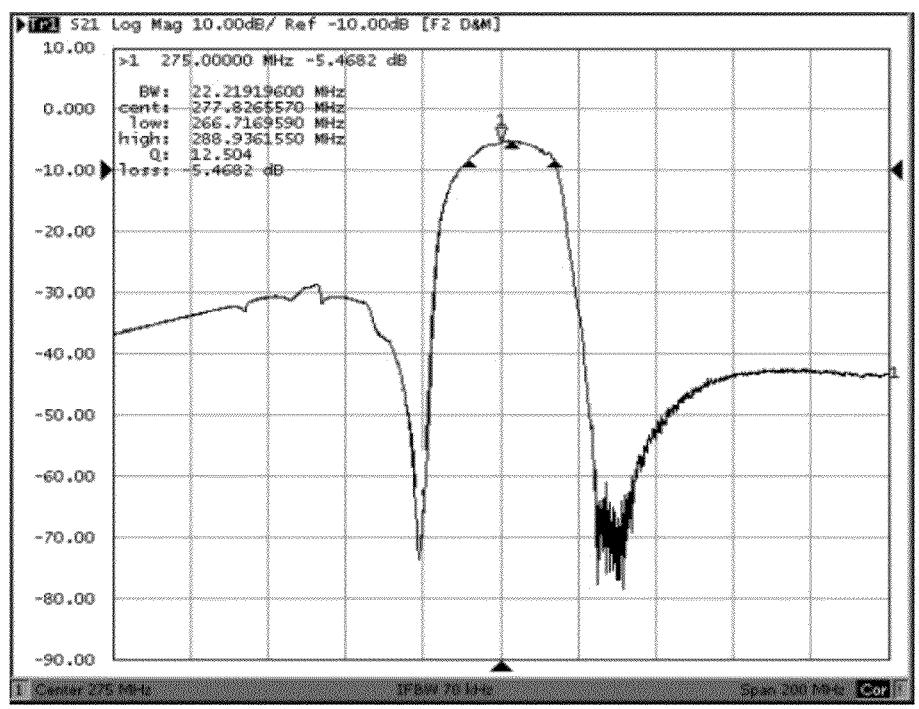
FIG. 15 depicts a filtering output characteristic of the superlattice crystal filter illustrated in FIG. 13.

Around 276 MHz, the three superlattice crystal resonators of the serial branch operate around the resonance point, and the four superlattice crystal resonators of the parallel branches operate around the anti-resonance point, so that at this moment the impedance is the smallest, thereby forming the pass band of the filter. Around 301 MHz and 253 MHz, the three superlattice crystal resonators of the serial branch operate around the anti-resonance point, and the four superlattice crystal resonators of the parallel branches operate around the resonance point, so that at this moment the impedance is the largest, thereby forming the stop band of the filter. With a peripheral matching circuit connection as illustrated in FIG. 14, where a 70 nH inductor L is connected in series with each of the input and the output of the superlattic crystal filter of this embodiment, the filtering performance measured was: pass-band loss of 5.4 dB and stop-band loss of 30 dB (see FIG. 15). The dimension of the entire superlattice crystal filter was 12 mm×8 mm×3.5 mm.

The above combined superlattice crystal filter was then attached to a large-power radio frequency signal generator. When the power was adjusted to exceed 5 W and after operating for a while, the amplitude-frequency output property of the filter deteriorated. Accordingly, it was determined that the maximum power capacity of the combined superlattice crystal filter is 5 W.

Embodiment 6

Combined Superlattice Crystal Filter C

Figure 16:
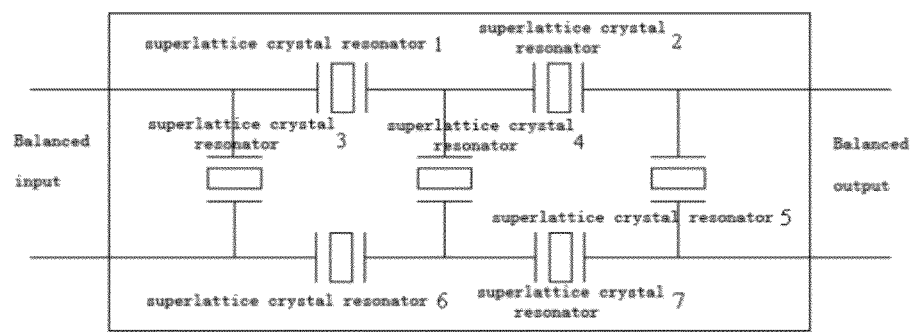
FIG. 16 depicts a schematic layout view of a balanced input-output combined superlattice crystal filter.

As illustrated in FIG. 16, the superlattice crystal filter of this embodiment was entirely formed by superlattice crystal resonators, which is also referred to as a combined superlattice crystal filter. This embodiment comprised: four superlattice crystal resonators 1, 2, 6, 7, forming serial branches; and three superlattice crystal resonators 3, 4, 5, forming parallel branches. Each of the seven superlattice crystal resonators is a one-port superlattice crystal resonator as described in Embodiment 1. The specific structure of the combined superlattice crystal filter in this embodiment is as below: the superlattice crystal resonators 1, 2 are connected in series with each another, and the superlattice crystal resonators 6,7 are connected in series with each another; two ends and an in-between node of the serial branch formed by the superlattice crystal resonators 1, 2 are connected to the first ends of each the superlattice crystal resonators 3-5, respectively, and the second ends of the superlattice crystal resonators 3-5 are connected to two ends and an in-between node of the serial branch formed by the superlattice crystal resonators 6 and 7, respectively; two ends of the superlattice crystal resonator 3 are used as a balanced input, and two ends of the superlattice crystal resonator 5 are used as a balanced output. In this configuration, a balanced input-output combined superlattice crystal filter was formed in a completely symmetric structure.

In this embodiment, the center frequency is 884.375 MHz, and the bandwidth is 12 MHz. Superlattice crystal material substrates with a vibration period of 6.3 μm were selected and plated with electrodes in the mode of FIG. 2. Four superlattice crystal resonators with a resonance frequency of 885.6 MHz and respective anti-resonance frequencies of 898.1 MHz, 898.3 MHz, 898.1 MHz, and 898.2 MHz were used to form the serial branches. Superlattice crystal material substrates with a vibration period of 6.4 μm were selected and plated with electrodes in the mode of FIG. 2. Four superlattice crystal resonators with a resonance frequency of 869 MHz and respective anti-resonance frequencies of 884.2 MHz, 884.5 MHz, and 884.3 MHz were used to form the parallel branches.

Figure 17:
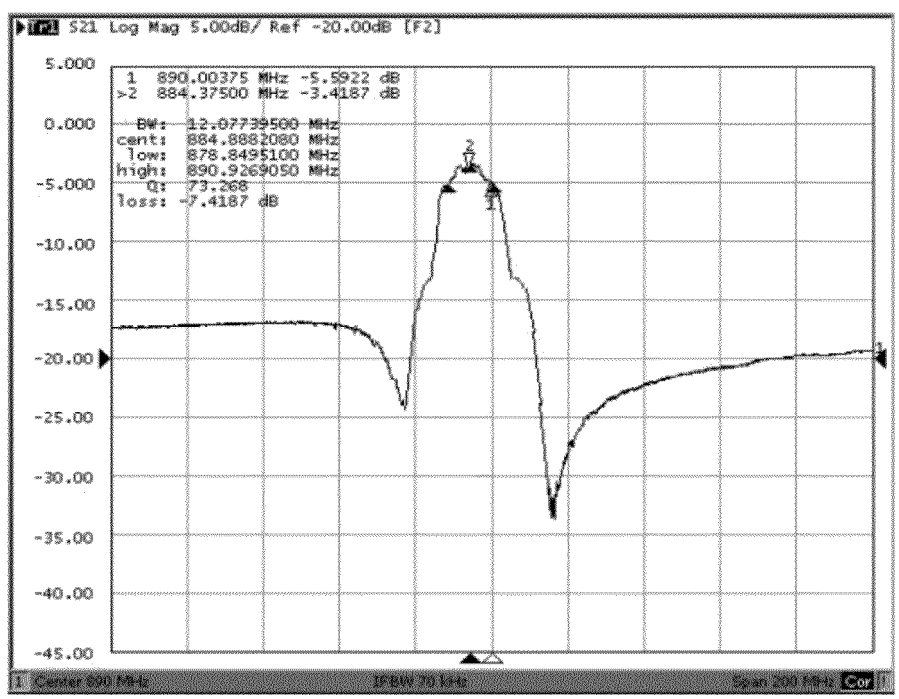
FIG. 17 depicts a filtering output characteristic of the superlattice crystal filter illustrated in FIG. 16.

Through 50 ohm balanced input and output, the filtering performance of this embodiment measured was: pass-band loss of 3.4 dB and stop-band loss of 18 dB (see FIG. 17). The dimension of the entire superlattice crystal filter was 12 mm×8 mm×3.5 mm.

The above combined superlattice crystal filter was then attached to a high-power radio frequency signal generator. When the power was adjusted to exceed 5 W and after operating for a while, the amplitude-frequency output property of the filter deteriorated. Accordingly, it was determined that the maximum power capacity of the combined superlattice crystal filter is 5 W.

While there have been described and pointed out fundamental novel features of the invention as applied to a preferred embodiment thereof, it will be understood that various omissions and substitutions and changes, in the form and details of the embodiments illustrated, may be made by those skilled in the art without departing from the spirit of the invention. The invention is not limited by the embodiments described above which are presented as examples only but can be modified in various ways within the scope of protection defined by the appended patent claims.

What is claimed is:

1. A superlattice crystal resonator, comprising a substrate of a dielectric acoustic superlattice material, a first electrode plated on a first side of said substrate, and a second electrode plated on a second side of said substrate, wherein said first electrode and second electrode are both single pole electrode, serving as an electrical input and an electrical output, respectively.

2. A superlattice crystal resonator, comprising a substrate of a dielectric acoustic superlattice material, a first electrode plated on a first side of said substrate, and a second electrode plated on a second side of said substrate, wherein said first electrode is bipolar with one pole serving as an electrical input and another pole as an electrical output, and said second electrode is connected to ground.

3. A superlattice crystal filter, comprising at least one superlattice crystal resonator comprising a substrate of a dielectric acoustic superlattice material, a first electrode plated on a first side of said substrate, and a second electrode plated on a second side of said substrate.

4. The superlattice crystal filter of claim 3, wherein in said resonator said first electrode is bipolar with one pole serving as an electrical input and another pole as an electrical output, and said second electrode is connected to ground.

5. The superlattice crystal filter of claim 3, comprising a plurality of superlattice crystal resonator comprising a substrate of a dielectric acoustic superlattice material, a first electrode plated on a first side of said substrate, and a second electrode plated on a second side of said substrate, which are connected with each other in series and form a serial branch, and a plurality of parallel branches each having a first end and a second end, wherein said first end of each said parallel branch is in connection with an end of one of said superlattice crystal resonators in said serial branch, and said second end of each said parallel branch is connected to common ground.

6. The superlattice crystal filter of claim 5, wherein each of said parallel branches is a LC resonance circuit.

7. The superlattice crystal filter of claim 6, wherein said LC resonance circuit comprises a capacitor branch connected in parallel with a serial branch comprising an inductor and a capacitor.

8. The superlattice crystal filter of claim 5, wherein each of said parallel branches is a superlattice crystal resonator comprising a substrate of a dielectric acoustic superlattice material, a first electrode plated on a first side of said substrate, and a second electrode plated on a second side of said substrate.

9. The superlattice crystal filter of claim 3, comprising a plurality of superlattice crystal resonators comprising a substrate of a dielectric acoustic superlattice material, a first electrode plated on a first side of said substrate, and a second electrode plated on a second side of said substrate, wherein said superlattice crystal resonators form a first serial branch and a second serial branch, each of said first serial branch and said second serial branch comprises at least two of said superlattice crystal resonators interconnected in series, and a plurality of parallel beaches each of which comprises one of said superlattice crystal resonators.

10. The superlattice crystal filter of claim 9, wherein each of said parallel branches has a first end and a second end, said first end is in connection with an end of one of said superlattice crystal resonators in said first serial branch, and said second end is in connection with an end of one of said superlattice crystal resonators in said second serial branch.

11. The superlattice crystal filter of claim 9, wherein there are three parallel branches each of which is a superlattice crystal resonator comprising a substrate of a dielectric acoustic superlattice material, a first electrode plated on a first side of said substrate, and a second electrode plated on a second side of said substrate.

* * * * *